(12) United States Patent
Kodama et al.

(10) Patent No.: US 10,429,543 B2
(45) Date of Patent: Oct. 1, 2019

(54) SUBSTRATE DETECTION APPARATUS, SUBSTRATE DETECTION METHOD AND SUBSTRATE PROCESSING SYSTEM

(71) Applicant: TOKYO ELECTRON LIMITED, Tokyo (JP)

(72) Inventors: Toshiaki Kodama, Nirasaki (JP); Shinji Wakabayashi, Nirasaki (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 501 days.

(21) Appl. No.: 15/018,277

(22) Filed: Feb. 8, 2016

(65) Prior Publication Data

US 2016/0240412 A1    Aug. 18, 2016

(30) Foreign Application Priority Data

Feb. 13, 2015 (JP) ................... 2015-026750

(51) Int. Cl.
*G01V 8/20* (2006.01)
*H01L 21/67* (2006.01)

(52) U.S. Cl.
CPC .......... *G01V 8/20* (2013.01); *H01L 21/67265* (2013.01)

(58) Field of Classification Search
CPC ...... G01V 8/12; G01V 8/20; H01L 21/67259; H01L 21/67265; H01L 21/681
USPC ........................................................ 901/47
See application file for complete search history.

(56) References Cited

U.S. PATENT DOCUMENTS

| 5,225,691 A * | 7/1993 | Powers ............. H01L 21/67265 250/223 R |
| 2006/0222236 A1* | 10/2006 | Osada ................... G03F 9/7011 382/151 |
| 2008/0319559 A1 | 12/2008 | De Ridder et al. |

FOREIGN PATENT DOCUMENTS

| JP | 64-057104 A | 3/1989 |
| JP | 10-084028 A | 3/1998 |
| JP | 11-214481 A | 8/1999 |
| JP | 200144263 A | 2/2001 |
| JP | 2009135276 A | 6/2009 |

* cited by examiner

*Primary Examiner* — Saul Rodriguez
*Assistant Examiner* — Brendan P Tighe
(74) *Attorney, Agent, or Firm* — Nath, Goldberg & Meyer; Jerald L. Meyer

(57) ABSTRACT

There is provided a substrate detection apparatus of detecting whether or not a substrate is normally supported by a support part at a predetermined position, in a transfer device including the support part configured to support a plurality of disc-like substrates in multi-stage processing at vertical intervals. The substrate detection apparatus includes: a plurality of optical sensors, each of the plurality of optical sensors including a light transmitting part configured to irradiate a light and a light receiving part configured to receive the light from the light transmitting part, wherein at least one pair of the plurality of optical sensors are disposed such that the light from the light transmitting part is sequentially blocked at each of the plurality of disc-like substrates, during the plurality of disc-like substrates is collectively transferred while being normally supported by the support part at the predetermined positions.

16 Claims, 16 Drawing Sheets

Amount of movement of support part [mm]

Amount of movement of support part [mm]

SUBSTRATE DETECTION APPARATUS, SUBSTRATE DETECTION METHOD AND SUBSTRATE PROCESSING SYSTEM

CROSS-REFERENCE TO RELATED APPLICATION

This application claims the benefit of Japanese Patent Application No. 2015-026750, filed on Feb. 13, 2015, in the Japan Patent Office, the disclosure of which is incorporated herein in its entirety by reference.

TECHNICAL FIELD

The present disclosure relates to a substrate detection apparatus and a method thereof, which detect a presence or absence of a substrate such as a semiconductor wafer, or a misalignment thereof, when transferring the substrate, and a substrate processing system including the substrate detection apparatus.

BACKGROUND

In a semiconductor device manufacturing process, various processes such as a film formation, an etching and so forth are repeatedly performed on a substrate such as a semiconductor wafer. As a semiconductor manufacturing apparatus of performing such processes, a substrate processing system in which a plurality of processing devices for performing different processes is installed, is used. Such a substrate processing system includes one or more substrate transfer devices to transfer a substrate inside the system including between the plurality of processing devices, and delivery the substrate between the system and other substrate processing system.

Such a substrate transfer device includes a transfer arm which is capable of performing operations such as bending and stretching, swing, elevating, linearly-moving and the like. In addition, the substrate transfer device transfers the substrate while holding the substrate using a support part installed in a leading end of the transfer arm.

During the transfer, due to various factors, a substrate may not exist in the support part, or the substrate may be transferred while being misaligned from a predetermined position of the support part. When the substrate does not exist or when the substrate is deviated from a permissible range in the support part, it is difficult to accurately transfer the substrate inside the substrate processing system, e.g., between the processing devices and the substrate transfer devices, or deliver the substrate between the substrate processing system and the other substrate processing system. This reduces the accuracy of the processes such as the film formation, the etching and so forth, and throughput, which causes a reduced yield. In addition, the excessive misalignment may cause some damages to the substrate by colliding with a member along a transfer path or being dropped down from a holding member, in the course of the transfer.

There is known a technique in which an optical sensor is used to detect a presence or absence of a substrate or a misalignment thereof in a support part in the course of the transfer. For example, there is proposed a method of irradiating light along an optical axis perpendicular to a surface of a circular substrate which is being transferred, detecting a change in signal when the circular substrate traverses through the optical axis, converting the change in signal into coordinates to obtain a central coordinate of a virtual circle, and calculating an amount of misalignment of the substrate.

There are also proposed techniques for irradiating light along an optical axis inclined with respect to a surface of a substrate which is being transferred, and detecting a presence or absence of the substrate or a misalignment thereof. However, in a case where a plurality of substrates is transferred while being held in multi-stage processing, such techniques require a plurality of optical sensors which is installed individually for every substrates held in each multi-stage processing.

That is to say, in the case where the plurality of substrates is transferred while being held in multi-stage processing, individual optical sensors are installed with respect to the respective substrates to find out positions of the respective substrates in the course of the transfer. This requires a space in which the individual optical sensors are installed and increases a cost for installing, thus resulting in an overall increase in footprint or an increased cost. In particular, there are significant limitations in arranging the plurality of optical sensors in a limited transfer space of the substrate processing system by the number of the substrates.

SUMMARY

Some embodiments of the present disclosure provide a technique of surely detecting a presence or absence of a substrate or a misalignment thereof with a reduced number of sensors, when a plurality of substrates held in multi-stage processing is transferred.

According to one embodiment of the present disclosure, there is provided a substrate detection apparatus of detecting whether or not a substrate is normally supported by a support part at a predetermined position, in a transfer device including the support part configured to support a plurality of disc-like substrates in multi-stage processing at vertical intervals. The substrate detection apparatus includes: a plurality of optical sensors, each of the plurality of optical sensors including a light transmitting part configured to irradiate a light and a light receiving part configured to receive the light from the light transmitting part, wherein at least one pair of the plurality of optical sensors are disposed such that the light from the light transmitting part is sequentially blocked at each of the plurality of disc-like substrates, during the plurality of disc-like substrates is collectively transferred while being normally supported by the support part at the predetermined positions.

According to another embodiment of the present disclosure, there is provided a substrate processing system including: a transfer device including a support part configured to support a plurality of disc-like substrates in multi-stage processing at vertical intervals; and a substrate detection apparatus configured to detect whether or not the plurality of substrates is normally supported by the support part of the transfer device at predetermined positions, wherein the substrate detection apparatus is provided with a plurality of optical sensors, each of the plurality of optical sensors including a light transmitting part configured to irradiate a light and a light receiving part configured to receive the light from the light transmitting part, and wherein at least one pair of the plurality of optical sensors are disposed such that the light irradiated from the light transmitting part is sequentially blocked at each of the plurality of disc-like substrates, during the plurality of substrates is collectively transferred while being normally supported by the support part at the predetermined positions.

According to yet another embodiment of the present disclosure, there is provided a substrate detection method of detecting, using the aforementioned substrate detection apparatus, at least one of a presence or absence of a substrate and a misalignment thereof based on a change in detection signal obtained at a light receiving part in at least one pair of optical sensors and an amount of movement of a support part.

BRIEF DESCRIPTION OF THE DRAWINGS

The accompanying drawings, which are incorporated in and constitute a part of the specification, illustrate embodiments of the present disclosure, and together with the general description given above and the detailed description of the embodiments given below, serve to explain the principles of the present disclosure.

DETAILED DESCRIPTION

Reference will now be made in detail to various embodiments, examples of which are illustrated in the accompanying drawings. Further, in the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

[Substrate Processing System]

Figure 1:
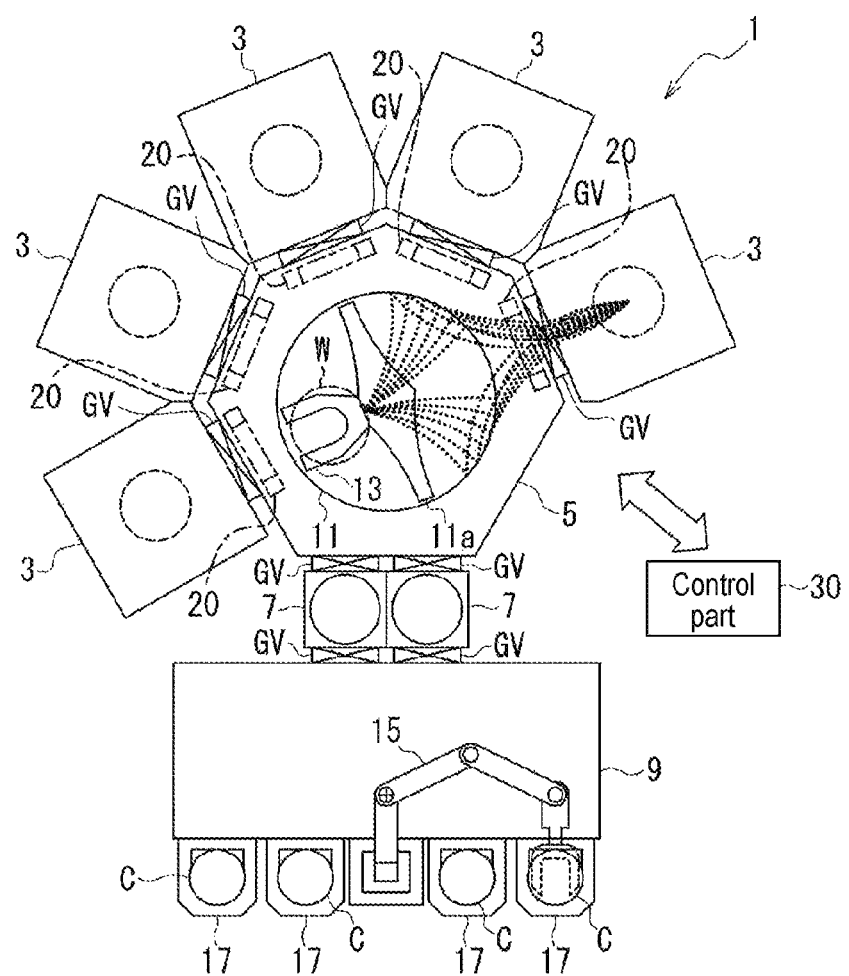
FIG. 1 is a schematic view showing a configuration of a substrate processing system according to an embodiment of the present disclosure.

FIG. 1 is a schematic view showing a configuration of a substrate processing system 1 according to an embodiment of the present disclosure. The substrate processing system 1 includes five process modules 3, a vacuum transfer chamber 5, two load lock chambers 7 and an atmospheric-pressure transfer chamber 9.

<Process Module>

Each of the process modules 3 performs a desired process on a semiconductor wafer (hereinafter, simply referred to as a "wafer") W. The process modules 3 are kept in a desired depressurized state by an exhaust mechanism (not shown).

<Vacuum Transfer Chamber>

The vacuum transfer chamber 5 is coupled to each of the process modules 3 and the load lock chambers 7 through respective gate valves GV. The vacuum transfer chamber 5 includes a transfer device 11 which is configured to collectively transfer the wafers W arranged in multi-stage processing at vertical intervals. The transfer device 11 includes a transfer arm 11a which is configured to be bendable and stretchable, swivable, elevatable and linearly-movable. The transfer arm 11a is equipped with a multi-stacked support part 13. The transfer device 11 includes an encoder (not shown) configured to detect a position of the support part 13 when advancing and retracting the support part 13 of the transfer arm 11a. The transfer device 11 collectively transfers the wafers W supported by the support part 13 in multi-stage processing, between the respective process modules 3 and the vacuum transfer chamber 5 and between the vacuum transfer chamber 5 and the respective load lock chambers 7.

Further, in the vicinity of a portion facing each of the process modules 3 inside the vacuum transfer chamber 5, a sensor part 20 is installed to detect a presence or absence of the wafer W or a misalignment thereof, in the course of collectively transferring the wafers W supported by the support part 13 of the transfer device 11 in multi-stage processing. A detailed configuration of the sensor part 20 will be described later.

<Load Lock Chamber>

The load lock chamber 7 is configured to switch between a vacuum environment and an atmospheric environment. Gate valves GV are respectively installed between each of the load lock chambers 7 and the atmospheric-pressure transfer chamber 9.

<Atmospheric-Pressure Transfer Chamber>

The atmospheric-pressure transfer chamber 9 includes a transfer device 15 configured to hold the wafer W. The transfer device 15 is configured to be bendable and stretchable, swivable, elevatable and linearly-movable. Further, the atmospheric-pressure transfer chamber 9 is connected to four ports 17. Cassettes C each capable of accommodating the plurality of wafers W are mounted on the respective ports 17.

<Control Part>

Figure 2A:
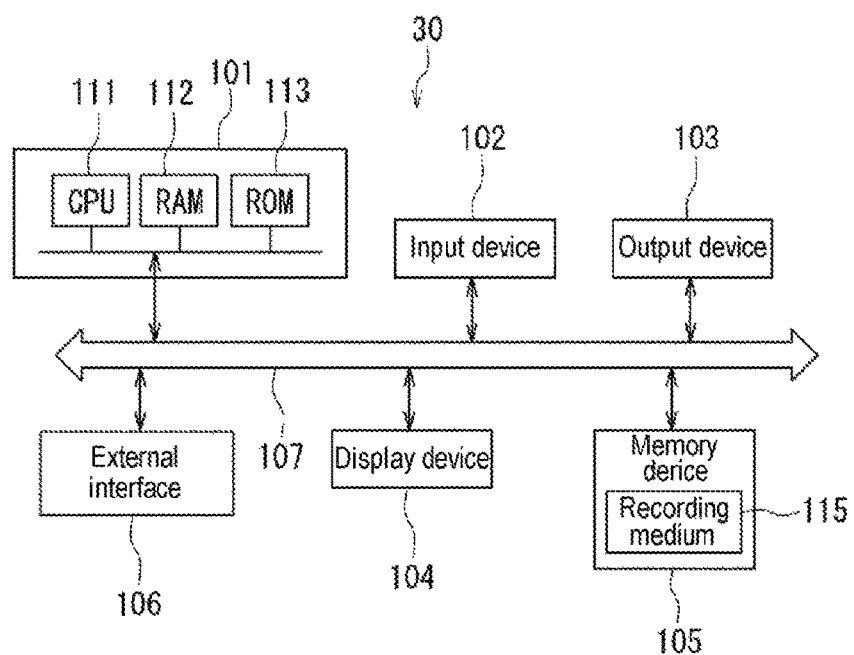
FIG. 2A is a block diagram showing an example of a hardware configuration of a control part of the substrate processing system shown in FIG. 1.

Further, the substrate processing system 1 includes a control part 30. Respective component parts of the substrate processing system 1 are respectively connected to the control part 30 so that they are controlled by the control part 30. FIG. 2A shows an example of a hardware configuration of the control part 30 shown in FIG. 1. The control part 30 includes: a main control section 101; an input device 102 such as a keyboard, a mouse and so forth; an output device 103 such as a printer and so forth; a display device 104; a memory device 105; an external interface 106; and a bus 107 interconnecting the forgoing devices or parts. The main control section 101 includes a CPU (central processing unit) 111, a RAM (random access memory) 112, and a ROM (read only memory) 113. The memory device 105 is not limited to a specified type as long as it can store information. An example of the memory device 105 may include a hard disk or an optical disc. The memory device 105 is configured to record information in a computer-readable recording medium 115, or read information out of the recording medium 115. The recording medium 115 is not limited to a specified type as long as it can store information. An example of the recording medium 115 may include a hard disk, an optical disk, a flash memory, or the like. The recording medium 115 may be one in which a recipe of a processing method of the wafer W is recorded.

In the control part 30, the CPU 111 executes a program stored in the ROM 113 or the memory device 105 using the RAM 112 as a working area such that the substrate processing system 1 performs a process with respect to the wafer W. Specifically, in the substrate processing system 1, the control part 30 controls the respective component parts (the transfer devices 11 and 15, the sensor parts 20, the process modules 3, and so forth) related to, for example, the transfer of the wafer W, the process of the wafer W, and so forth.

Figure 2B:
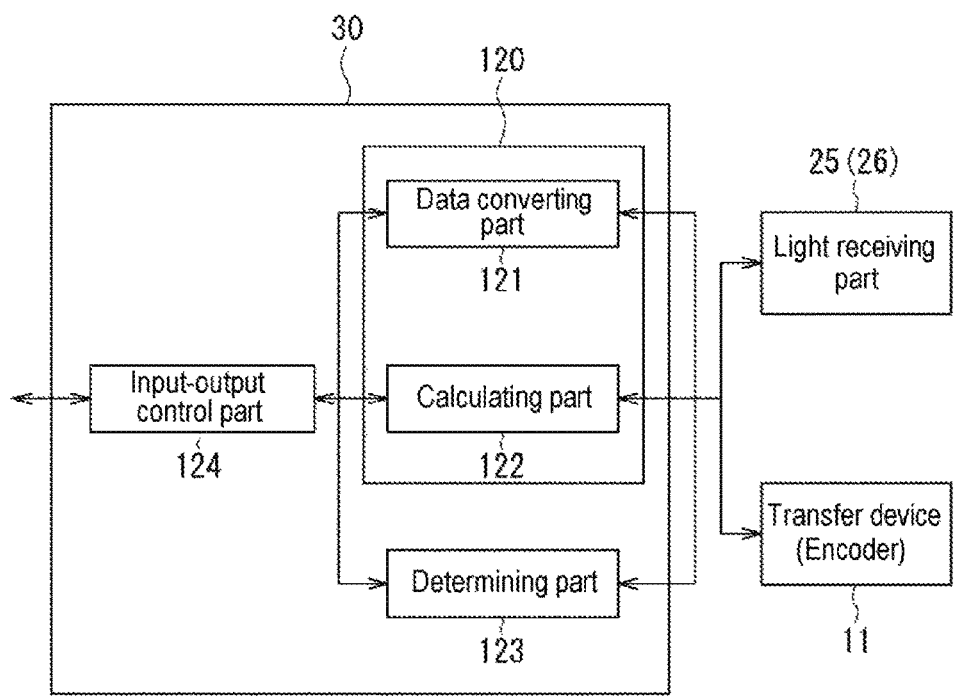
FIG. 2B is a functional block diagram of the control part of the substrate processing system shown in FIG. 1.

FIG. 2B is a functional block diagram showing functions involved in detecting a presence or absence of the wafer W or a misalignment thereof, which are performed by the control part 30. As shown in FIG. 2B, the control part 30 includes a data converting part 121, a calculating part 122, a determining part 123, and an input-output control part 124. The data converting part 121 and the calculating part 122 constitutes a data processing part 120. The CPU 111 executes a software (a program) stored in the ROM 113 or the memory device 105 using the RAM 112 as the working area so that processes involved with the control part 30 are fulfilled. Further, the control part 30 may have another function, but a description thereof will be omitted herein.

(Data Converting Part)

The data converting part 121 performs, for example, a data conversion process which includes: receiving a signal detected at a light receiving part of an optical sensor of the sensor part 20, and an encoder value of the transfer arm 11*a*; performing a coordinate transformation on the received data; and converting the same into a predetermined output signal, which will be described later.

(Calculating Part)

The calculating part 122 performs various arithmetic processes which include, for example, obtaining a center position of the wafer W or calculating an amount of misalignment of the wafer W, based on the output signal provided from the data converting part 121.

(Determining Part)

The determining part 123 determines a presence or absence of the wafer W or a misalignment thereof, based on data processing results obtained at the data processing part 120.

(Input-Output Control Part)

The input-output control part 124 controls an input operation of the input device 102, an output operation of the output device 103, a display operation of the display device 104, and a data input/output operation using the external interface 106 with respect to the outside.

[Sensor Part]

Next, the sensor part 20 used as a substrate detection apparatus will be described in detail with reference to FIGS. 3 to 6. In the transfer arm 11*a* including the support part 13 configured to support the plurality of wafers W in multi-stage processing at vertical intervals, the sensor part 20 detects whether or not the respective wafers W are normally supported by the support part 13 at predetermined positions of the support part 13 using an optical means.

First Embodiment

Figure 3:
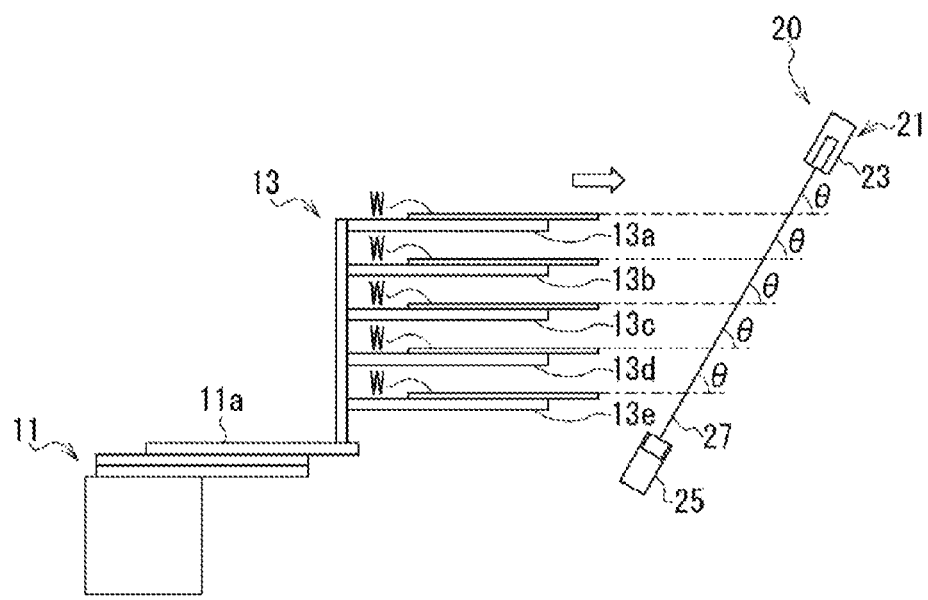
FIG. 3 is a schematic view showing a configuration of a sensor part according to a first embodiment of the present disclosure, in relationship to an operation of a support part.

FIG. 3 is a schematic view showing a configuration of the sensor part 20 according to a first embodiment of the present disclosure, in relationship to an operation of the support part 13 configured to support the plurality of wafers W in multi-stage processing. In this embodiment, the support part 13, which is installed in a leading end of the transfer arm 11*a* of the transfer device 11, includes five stages of hands 13*a* to 13*e* arranged from top to bottom. The wafers W are supported by the respective hands 13*a* to 13*e* while being mounted in a substantially horizontal posture. In this fashion, in this embodiment, the support part 13 collectively transfers the wafers W to, e.g., the process module 3, while supporting the five wafers W at maximum in multi-stage processing. In FIG. 3, a white arrow indicates an advance direction of the support part 13, and a direction opposite to the advance direction indicates a retract direction of the support part 13. Moreover, the advance/retract direction of the support part 13 refers to a Y direction (a transfer direction), and a direction perpendicular to the Y direction on a horizontal plane refers to an X direction (a width direction of the wafer W which is being transferred). Further, the number of the hands (the number of the wafers W) in such a collective multi-stage processing transfer is not limited to five (five stages).

As shown in FIG. 3, the optical sensor 21 includes a light transmitting part 23 configured to irradiate light and a light receiving part 25 configured to receive the light irradiated from the light transmitting part 23. In this embodiment, the light transmitting part 23 irradiates spotlight such as a laser beam toward the light receiving part 25. The light receiving part 25 is equipped with a light receiving element (not shown) such as a photodiode, a CCD, or the like. The light receiving part 25 receives the light irradiated from the light transmitting part 23, and converts the same into an electric detection signal. The detection signal obtained at the light receiving part 25 is sent to the control part 30 for a subsequent processing.

Figure 4:
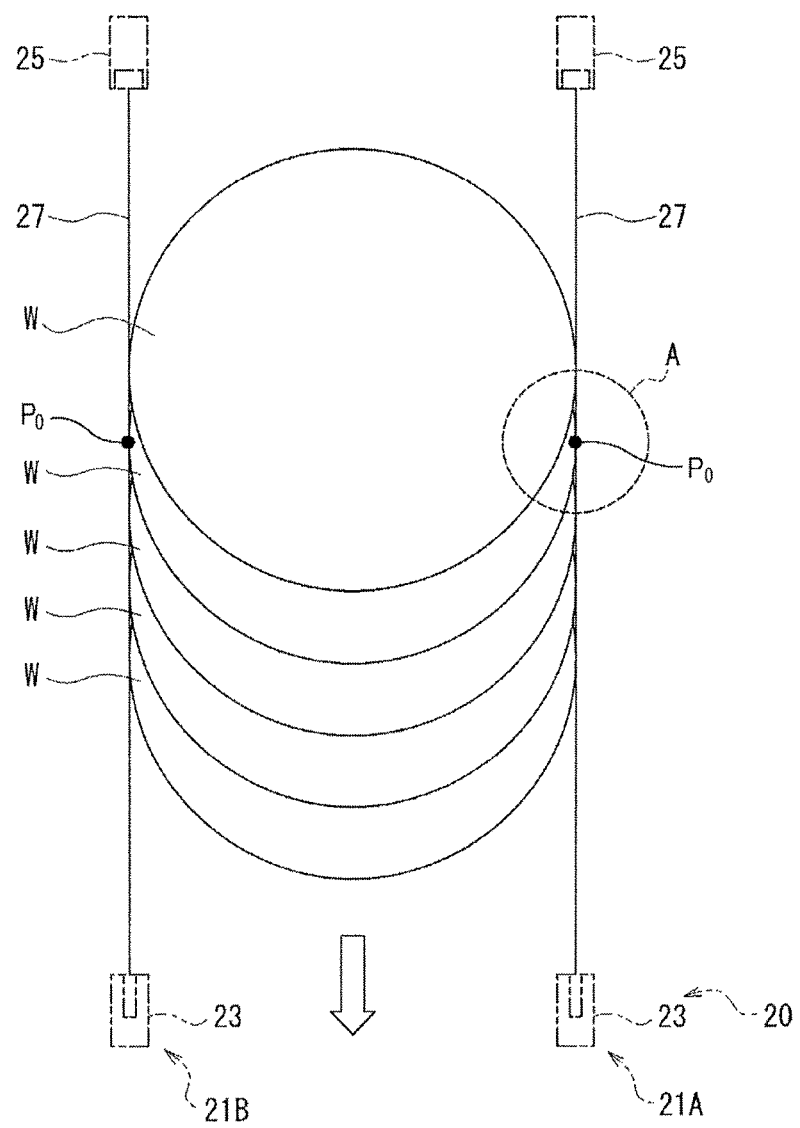
FIG. 4 is a view schematically showing a state where five semiconductor wafers are normally supported by a support part, when viewed from light transmitting parts along optical axes, in the first embodiment of the present disclosure.
Figure 5:
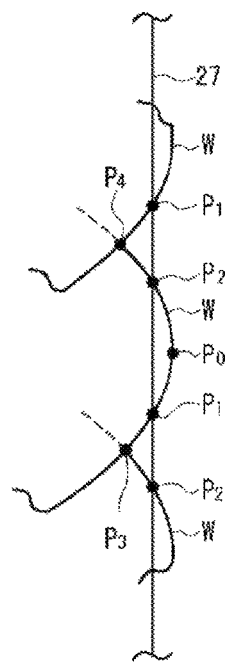
FIG. 5 is an enlarged view of a portion A shown in FIG. 4.

FIG. 4 is a view schematically showing a state where the five wafers W are transferred while being normally supported by the respective hands 13*a* to 13*e* of the support part 13 at predetermined positions (hereinafter, referred to sometimes as "normal transfer state") when viewed from the light transmitting parts 23 along optical axes 27. A white arrow in FIG. 4 indicates the advance direction of the support part 13, and a direction opposite to the advance direction indicates the retract direction of the support part 13. The sensor part 20 includes a pair of left and right optical sensors 21 disposed in parallel in the X direction. In FIG. 4, For the sake of simplicity, on the basis of the advance direction of the wafer W as indicated by the white arrow, one disposed at the left side in the advance direction is represented as a left optical sensor 21A, and one disposed at the right side in the advance direction is represented as a right optical sensor 21B. FIG. 5 is an enlarged view of a portion A shown in FIG. 4.

As shown in FIG. 3, the light transmitting part 23 and the light receiving part 25 are arranged such that the optical axes 27 of the spotlight irradiated from the light transmitting parts 23 toward the respective light receiving parts 25 intersect with an upper surface or a lower surface of each of the wafers W (which are in a substantially horizontal posture) supported by the support part 13 in multi-stage processing, at a predetermined angle θ except for a vertical direction (i.e., 90 degrees). The angle θ of the optical axes 27 with respect to the upper or lower surface of each of the wafers W may be set according to vertical intervals between the respective hands 13a to 13e of the support part 13. In this embodiment, the angle θ may be set to fall within a range from 60 to 80 degrees, and in some embodiments, from 65 to 75 degrees. Specifically, the angle θ may be set to 70 degrees.

As shown in FIGS. 4 and 5, in this embodiment, the pair of left and right optical sensors 21A and 21B are arranged such that the light irradiated from the light transmitting parts 23 travel toward the vicinities of both end portions $P_0$ of the wafer W in the X direction, in the normal transfer state. Further, the both end portions $P_0$ in the X direction (hereinafter, referred to as "X-direction both end portions $P_0$") are left and right end portions of the wafer W which are spaced apart from each other in the X direction. A distance between the left and right end portions corresponds to a diameter of the wafer W of a disc shape. Each of the optical axes 27 of the spotlight irradiated from the light transmitting parts 23 is set such that each of the optical axes 27 intersects with each of the wafers W at positions spaced apart by, e.g., a range from 3 to 10 mm, and in some embodiments, about 5 mm, inward from the X-direction both end portions $P_0$. In this embodiment, it is assumed that each of the optical axes 27 intersects with each of the wafers W at positions spaced apart by 5 mm inward from the X-direction both end portions $P_0$.

As described above, the light transmitting parts 23 and the light receiving parts 25 are respectively arranged such that each of the optical axes 27 is inclined with respect to the upper surface (or the lower surface) of the wafer W at the angle θ of, e.g., a range of from 60 to 80 degrees except for 90 degrees. Under this situation, when the support part 13 of the transfer arm 11a moves in the direction indicated by the white arrow in FIGS. 3 and 4, the light from the light transmitting parts 23 can be irradiated in sequence starting from the wafer W held in the lowermost stage to the wafer W held in the uppermost stage. In other words, in the normal transfer state, a pair of lights generated from the light transmitting parts 23 are first blocked at the vicinities of the X-direction both end portions $P_0$ of the lowermost wafer W (a first wafer W) which is supported by the hand 13e, and then re-transmitted onto the light receiving parts 25. Thereafter, the pair of lights are respectively blocked at the vicinities of the X-direction both end portions $P_0$ of a subsequent wafer W (a second wafer) which is supported by the hand 13d, and then re-transmitted onto the light receiving parts 25. Such a sequence of blocking and re-incidence operations are repeated with respect to subsequent wafers W (third, fourth and fifth wafers), wherein the fifth wafer W is the uppermost wafer. For example, as shown in FIG. 5, in the normal transfer state, in the vicinity of one of the X-direction both end portion $P_0$ of the fourth wafer W which is supported by the hand 13b, the spotlight from the light transmitting part 23 is blocked at a portion $P_1$ on an edge of the fourth wafer W, and then re-transmitted onto the respective light receiving part 25 beyond a portion $P_2$. In other words, the spotlight is blocked at an interval between the portions $P_1$ and $P_2$. The same operation is also applied with respect to the other of the X-direction both end portion $P_0$ of the wafer W.

Further, the light receiving parts 25 detect changes in signal between when the spotlights from the respective light transmitting parts 23 are blocked at the vicinities of the X-direction both end portions $P_0$ of the wafer W and when the spotlights are re-transmitted onto the respective light receiving parts 25, and send the same to the data processing part 120. However, in an abnormal transfer state, for example, when the wafer W does not exist in the fourth hand 13b, or when the wafer W is substantially misaligned in the X direction to an extent exceeding 5 mm, at least one of the optical sensors 21A and 21B fails to detect the blocking of the spotlight. Thus, a detection signal obtained at the respective light receiving part 25 is not changed. In this way, it is possible to detect the presence or absence of the wafer W, or the substantial misalignment thereof.

Moreover, since the pair of left and right optical sensors 21A and 21B is respectively disposed in the vicinities of the X-direction both end portions $P_0$ of the wafer W, the data processing part 120 can calculate coordinates of two sets of the portions $P_1$ and $P_2$ in an X-Y plane (a horizontal plane), based on changes in detection signals obtained at one set of left and right portions ($P_1$, $P_1$) and one set of left and right portions ($P_2$, $P_2$) and an encoder value of the support part 13 in the transfer arm 11a obtained at this time. Therefore, it is possible to detect a misalignment of the wafer W in each of the hands 13a to 13e of the support part 13. For example, when the wafer W supported by any one of the hands 13a to 13e of the support part 13 is misaligned, coordinates of the two sets of portions ($P_1$, $P_1$) and ($P_2$, $P_2$) where the detection signals change, are displaced from respective coordinates obtained in the normal transfer state. By detecting the displacement of the coordinates, for example, the determining part 123 can detect whether or not the wafers W are normally supported by the respective hands 13a to 13e of the support part 13 at predetermined positions thereof. In some embodiments, the coordinates of the two sets of portions ($P_1$, $P_1$) and ($P_2$, $P_2$) where the detection signals change in the normal transfer state, may be experimentally measured in advance. Alternatively, the coordinates may previously calculated based on the encoder value of the transfer arm 11a and normal positions where the wafers W are normally supported by the respective hands 13a to 13e.

In general, the center of a circle can be calculated by determining coordinates of three points on a circumference of the circle. Thus, the data processing part 120 can calculate a central coordinate of a wafer W to be detected, based on coordinates of at least three of the two sets of portions ($P_1$, $P_1$) and ($P_2$, $P_2$). By comparing the calculated central coordinate of the wafer W with the central coordinate of the respective wafer W calculated in the normal transfer state, it is possible to check whether or not the misalignment occurs, and also compute an amount of the displacement in the X and Y directions. In some embodiments, the central coordinate of the wafer W in the normal transfer state may be experimentally measured in advance. Alternatively, the central coordinate may be previously calculated based on the encoder value of the transfer arm 11a and the normal positions where the wafers W are normally supported by the respective hands 13a to 13e.

In FIG. 5, portions $P_3$ and $P_4$ represent intersection points of an upper wafer W with a lower wafer W which are apparently overlapped with each other in the vertical direction, when viewed from the light transmitting part 23 along the optical axis 27. In other words, the portion $P_3$ is a point where edges of the third and fourth wafers W when viewed from the light transmitting part 23 intersect with each other. The portion $P_4$ is a point where edges of the fourth and fifth wafers W when viewed from the light transmitting part 23 intersect with each other. In this embodiment, in the normal transfer state, the spotlight from the light transmitting part 23 may be set to be irradiated onto a zone defined by the X-direction end portion $P_0$ of the wafer W and the portions $P_3$ and $P_4$ (see FIG. 5). By irradiating the spotlight onto such a zone, it is possible to accurately detect the misalignment of the wafer W using the changes in the detection signals obtained at the light receiving part 25.

In this embodiment, the presence or absence of the wafer W and the misalignment thereof may be detected even when the support part 13 is retracted. For example, in the FIG. 3, when the support part 13 is retracted, in the normal transfer state, the lights from the light transmitting parts 23 are first blocked at the vicinities of the X-direction both end portions $P_0$ of the uppermost wafer (i.e., a first wafer) W supported by the hand 13a when viewed from the top, and then re-transmitted onto the respective light receiving parts 25. Subsequently, the lights are blocked at the vicinities of the X-direction both end portions $P_0$ of the second wafer W supported by the hand 13b, and then re-transmitted onto the respective light receiving parts 25. Such a sequence of blocking and re-incidence operations are repeated with respect to the third to fifth wafers W when viewed from the top, wherein the fifth wafer W is the lowermost wafer. However, when the wafer W does not exist on any one of the hands 13a to 13e or when the misalignment of the wafer W occurs, the detection signals obtained at the light receiving parts 25 are varied compared to the case of the normal transfer state. Therefore, similarly to the aforementioned way, for example, the determining part 123 can detect whether or not the wafers W exist in the respective hands 13a to 13e, or whether or not a misalignment thereof occurs.

In some embodiments, although not being shown in the drawings, the light transmitting parts 23 may be disposed below the hand 13e, and the light receiving parts 25 may be disposed above the hand 13a, unlike FIG. 3. In this case, the blocking of the light at the vicinities of the X-direction both end portions $P_0$ of the wafer W and the re-incidence of the light onto the light receiving parts 25 are performed in the same sequence as that described for the advance direction of the support part 13 in FIG. 3, and in the same sequence as that described for the retract direction of the support part 13 in FIG. 3.

Figure 6:
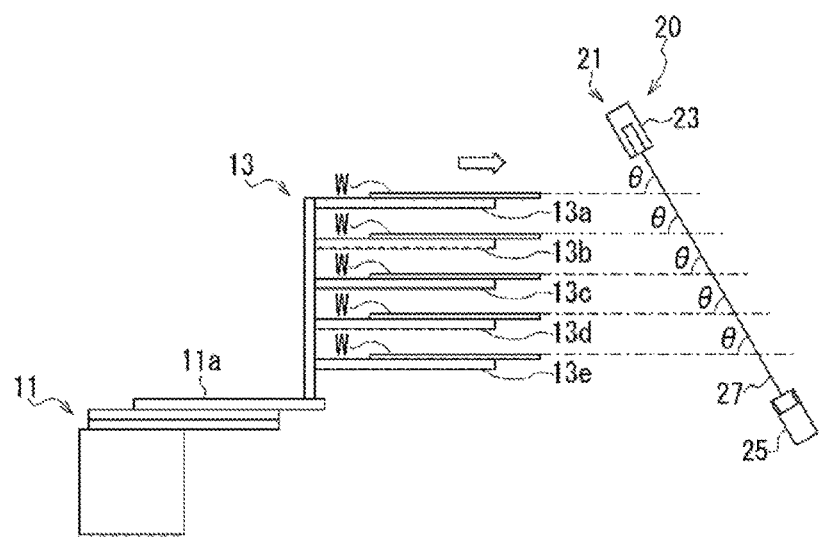
FIG. 6 is a schematic view showing another configuration example of the sensor part according to the first embodiment.

Further, as shown in FIG. 3, when viewed from the advance direction of the support part 13, the light receiving parts 25 is disposed at a front side (i.e., a side near the support part 13) in the lower side and the light transmitting parts 23 is disposed at a remote side (i.e., a side far from the support part 13) in the upper side, such that the optical axes 27 are obliquely formed. In some embodiments, the optical axes 27 may be formed to be inclined at any angle in the Y direction with respect to the vertical direction. As an example, as shown in FIG. 6, the optical axes 27 may be obliquely formed by disposing the light transmitting parts 23 at the front side (i.e., a side near the support part 13) in the upper side, and disposing the light receiving parts 25 at the remote side (i.e., a side far from the support part 13) in the lower side, when viewed from the advance direction of the support part 13. In this case, the blocking of the light at the vicinities of the X-direction both end portions $P_0$ of the wafer W and the re-incidence of the light onto the light receiving parts 25 are performed in the reverse sequence of that in FIG. 3 even in the advance and retract directions of the support part 13. In some embodiments, the light transmitting parts 23 and the light receiving parts 25 shown in FIG. 6 may be disposed to be inverted up and down. In this case, the blocking of the light at the vicinities of the X-direction both end portions $P_0$ of the wafer W and the re-incidence of the light onto the light receiving parts 25 are performed in the reverse sequence of that in FIG. 3 even in the advance and retract directions of the support part 13.

As described above, in this embodiment, at least one pair of the left and right optical sensors 21A and 21B are disposed such that the light is irradiated onto the vicinities of the X-direction both end portions $P_0$ of the wafer W in a state where the optical axes 27 are inclined at any angle in the advance and retract directions (the Y direction) of the support part 13. With this configuration, when collectively transferring the plurality of wafers W held in multi-stage processing, it is possible to detect the presence or absence of the wafer W or the misalignment thereof using the two optical sensors 21A and 21B.

Second Embodiment

Figure 7:
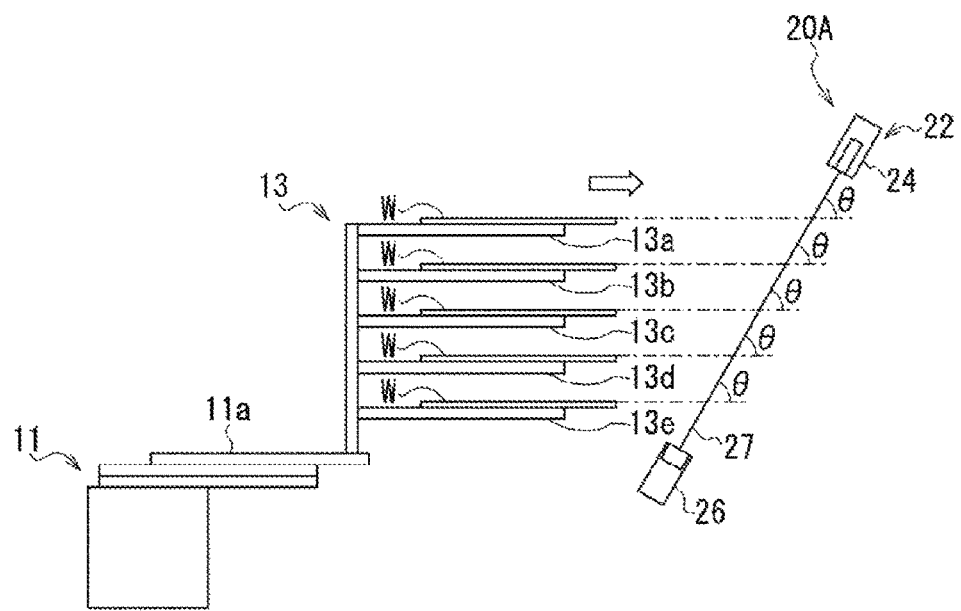
FIG. 7 is a schematic view showing a configuration of a sensor part according to a second embodiment of the present disclosure, in relationship to an operation of a support part.
Figure 8:
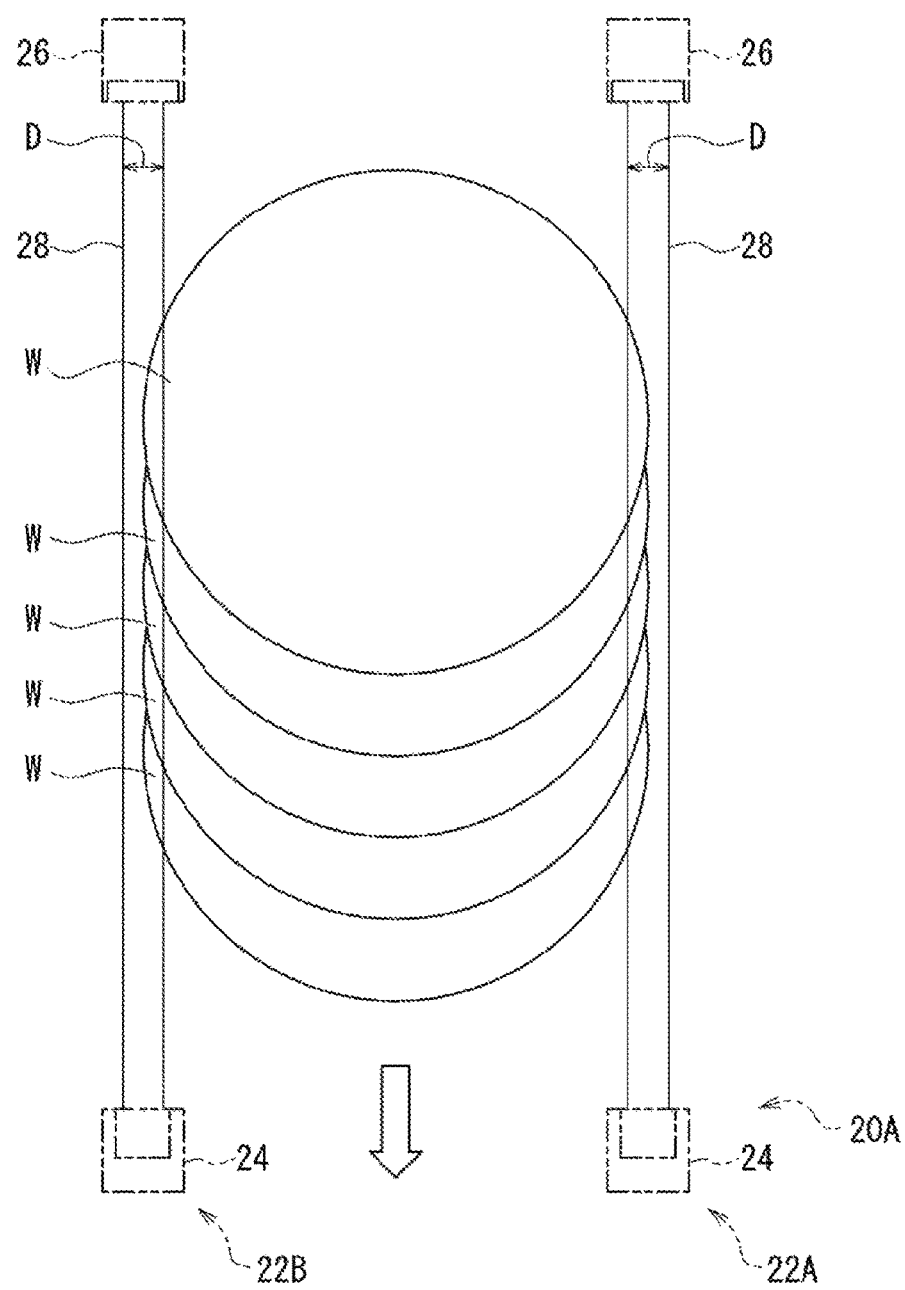
FIG. 8 is a view schematically showing a state where five semiconductor wafers are normally supported by the support part, when viewed from a light transmitting part along an optical axis, in the second embodiment of the present disclosure.

FIG. 7 is a schematic view showing a configuration of a sensor part 20A used as a substrate detection apparatus according to a second embodiment of the present disclosure, in relationship to the operation of the support part 13 configured to support the wafers W in multi-stage processing. FIG. 8 schematically shows a state where the five wafers W are transferred in the normal transfer state when viewed from the light transmitting parts 24 along the optical axes 27. In FIGS. 7 and 8, white arrows represent an advance direction of the support part 13, and the opposite direction of the advance direction is a retract direction of the support part 13. A configuration of the support part 13 is similar to that of the first embodiment.

The sensor part 20A according to this embodiment includes at least one pair of optical sensors 22. As shown in FIG. 7, each of the optical sensors 22 includes a light transmitting part 24 configured to irradiate light and a light receiving part 26 configured to receive the light irradiated from the light transmitting part 24. This embodiment is different from the first embodiment in that a length measuring sensor is used as the sensor part 20A. In other words, the light transmitting part 24 irradiates light (band-like light 28) such as a laser beam having a predetermined width toward the light receiving part 26.

In FIG. 8, for the sake of simplicity, on the basis of the advance direction of the wafer W which is represented by the white arrow, one disposed at the left side is represented as a left optical sensor 22A, and one disposed at the right side is represented as a right optical sensor 22B. Further, in FIG. 8, the band-like lights 28 each of which have a width D and is irradiated from the light transmitting part 24, is schematically shown to be being overlapped with the X-direction both end portions $P_0$ of the wafer W. The light receiving part 26 includes a light receiving element such as a photodiode, a CCD or the like. The light receiving parts 26 receive the band-like lights 28 irradiated from the respective light transmitting parts 24, and convert the same into electric detection signals. Each of the light receiving parts 26 sends the detection signal to the data processing part 120 of the control part 30 for process thereof.

As shown in FIG. 7, the light transmitting parts 24 and the light receiving parts 26 are respectively arranged such that the optical axes 27 of the band-like lights 28 which are irradiated from the light transmitting parts 24 toward the respective light receiving parts 26 intersect with the upper or lower surface (substantially horizontal surface) of each of the wafers W supported by the support part 13 in multi-stage processing at a predetermined angle θ except for 90 degrees. The angle θ of each of the optical axes 27 with respect to the upper or lower surface of the wafer W may be properly set according to vertical intervals between the hands 13a to 13e of the support part 13. In this embodiment, the angle θ may be set to be, e.g., within a range from 60 to 80 degrees, and in some embodiments, 65 to 75 degrees. Specifically, the angle θ is set to be 70 degrees.

As shown in FIG. 7, in this embodiment, the pair of optical sensors 22 are arranged at the left and right sides such that the band-like lights 28 from the light transmitting parts 24 are irradiated onto the vicinities of the X-direction both end portions $P_0$ of the wafer W in the normal transfer state. As shown in FIG. 8, the band-like light 28 from each of the light transmitting parts 24 is set to be irradiated with the predetermined width D to fall onto a zone covering the X-direction end portion $P_0$ of each of the wafers W. For example, the band-like light 28 from each of the light transmitting parts 24 is set to be irradiated onto the zone covering the X-direction end portion $P_0$ of each of the wafers W, with the width D ranging from 7 to 15 mm, and in some embodiments about 10 mm, in the X direction. More specifically, in this embodiment, in the normal transfer state, the band-like light 28 from each of the light transmitting parts 24 may be set to be irradiated onto the zone covering the portions $P_3$ and $P_4$ (see FIG. 5) and the end portion $P_0$ in the X direction. By irradiating the band-like lights 28 onto the aforementioned zones, it is possible to accurately detect a misalignment of the wafer W using changes in detection signals obtained at the respective light receiving parts 26.

As described above, the light transmitting parts 24 and the light receiving parts 26 are respectively arranged such that the angle θ of each of the optical axes 27 with respect to the upper or lower surface of the wafer W falls within a range of, for example, from 60 to 80 degrees, except for 90 degrees. Thus, when the support part 13 of the transfer arm 11a moves in the direction indicated by the white arrow in FIGS. 7 and 8, the band-like light 28 from each of the light transmitting parts 24 can be irradiated in sequence starting from the wafer W (a first wafer W) held in the lowermost stage to the wafer W (a fifth wafer W) held in the uppermost stage. In other words, in the normal transfer state, the pair of band-like lights 28 from the light transmitting parts 24 are first partially blocked at the vicinities of the X-direction both end portions $P_0$ of the first wafer W which is supported by the hand 13e. Subsequently, the pair of band-like lights 28 are partially blocked at the vicinities of the X-direction both end portions $P_0$ of a second wafer W, which is supported by the hand 13d as a second stage from the bottom. Such a partial blocking operation is repeated with respect to a sequence of third, fourth and fifth wafers (uppermost wafer). In a similar fashion as the partial blocking operation, the pair of band-like lights 28 are partially re-transmitted onto the respective light receiving part 26.

Further, each of the light receiving parts 26 detects signals obtained when some of the band-like light 28 having the width D irradiated from the respective light transmitting part 24 are blocked at the vicinity of the X-direction end portion $P_0$ of the disc-like wafer W and when the band-like light 28 is re-transmitted thereonto, calculates changes in the detection signals, and sends the same to the data processing part 120.

Here, in the normal transfer state, at the vicinity of one of the X-direction end portions $P_0$ of each of the five disc-like wafers W respectively supported by the hands 13a to 13e of the support part 13, the band-like light 28 irradiated from the respective light transmitting part 24 is partially blocked along an edge shape of the respective wafer W. Thus, for example, the data processing part 120 outputs five arc shape data obtained by approximating an outline of one edge of each of the five wafers W in the X direction, based on detection signals obtained at the light receiving part 26 of the left optical sensor 22A, and an encoder value of the transfer arm 11a. Similarly, the data processing part 120 outputs five arc shape data obtained by approximating an outline of the other edge of each of the five wafers W in the X direction, based detection signals obtained at the light receiving part 26 of the right optical sensor 22B and an encoder value of the transfer arm 11a.

Figure 9A:
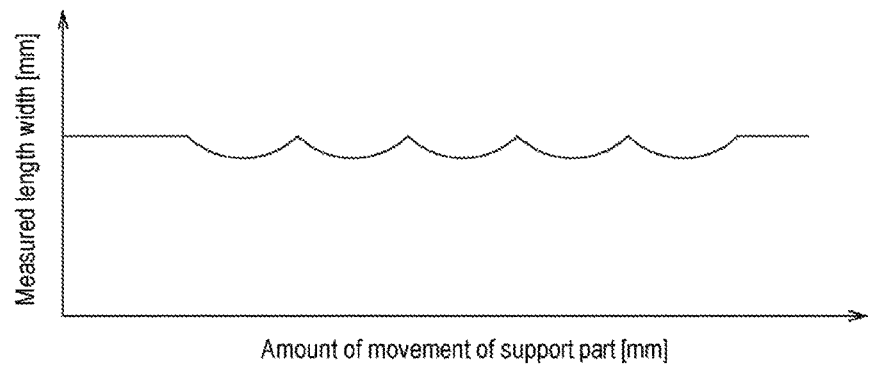
FIG. 9A is a graph showing an arc shape output signal obtained at a left optical sensor.
Figure 9B:
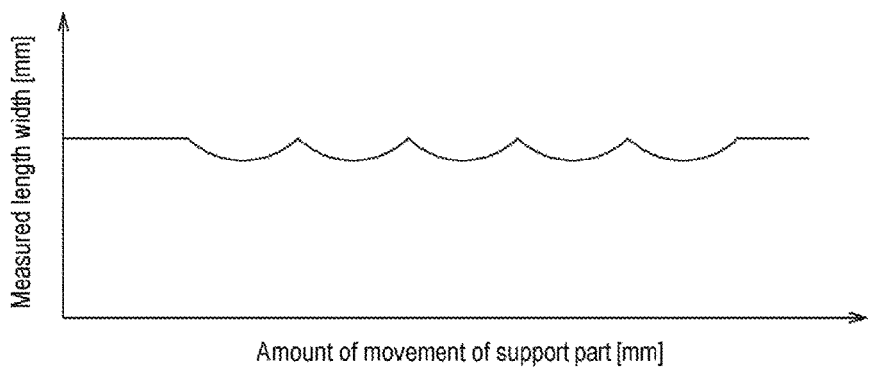
FIG. 9B is a graph showing an arc shape output signal obtained at a right optical sensor.

FIG. 9A shows an output data from the left optical sensor 22A of the pair of optical sensors 22, which is disposed at one side in the X direction, in the normal transfer state. FIG. 9B shows an output data from the optical sensor 22B, which is disposed at other side in the X direction, in the normal transfer state. In FIGS. 9A and 9B, the five arc shape data obtained by approximating the outline of the one edge of each of the five wafers W in the X direction is shown, respectively. Further, in FIGS. 9A and 9B, vertical axes represent measured length widths (width of a received light) detected at the light receiving parts 26, and horizontal axes represent amounts of movement of the support part 13 of the transfer arm 11a. For example, assuming that a wafer W does not exist in any one of the hands 13a to 13e. Then, the light is not blocked at a portion having none of that wafer W. Thus, a signal detected at the light receiving part 26 does not change. Therefore, for example, in the output data shown in FIGS. 9A and 9B, only four arc shapes only are manifested. In this way, for example, the determining part 123 is capable of detecting a presence or absence of the wafer W based on an output data corresponding to the arc shapes. Further, in some embodiments, in FIGS. 9A to 9B, the determining part 123 may use a threshold set for a height of an arc (i.e., a size of the measured length width) so as to determine whether or not a peak of the arc exceeds the threshold and detect the presence or absence of the wafer W.

Figure 10:
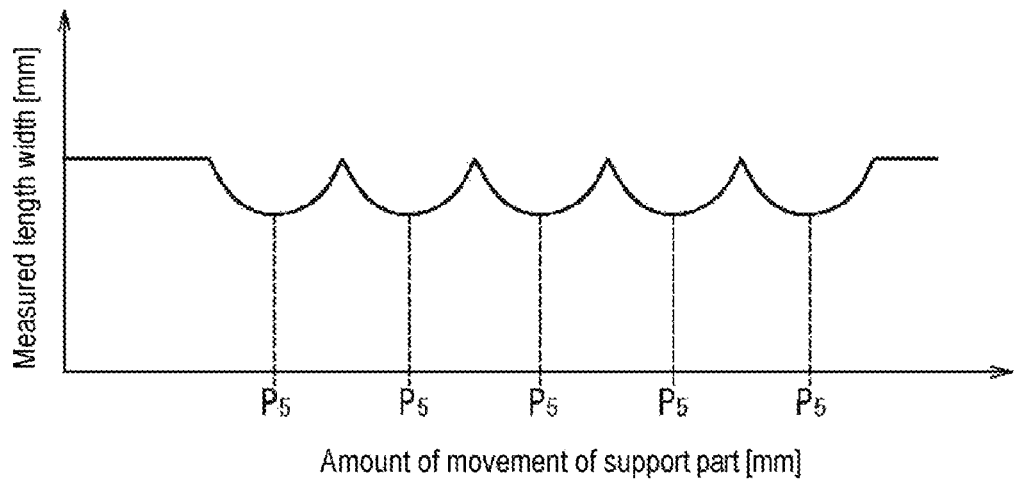
FIG. 10 is a graph showing a state where the arc shape output signals shown in FIGS. 9A and 9B are composed.

FIG. 10 is a graph showing a state where the arc shape output data shown in FIGS. 9A and 9B are composed. In other words, FIG. 10 shows composition results of the arc shape output data obtained at each of the left and right optical sensors 22A and 22B in the data processing part 120. Here, vertical broken lines in FIG. 10 represent passing points $P_5$ where the band-like light 28 passes through the X-direction end portion $P_0$ of each of the wafers W in the normal transfer state. Each of the passing points $P_5$ can be calculated based on the encoder value of the transfer arm 11a, the vertical intervals between the hands 13a to 13e, installation positions of the pair of optical sensors 22, the angle θ, and so forth. For the normal transfer state, as shown in FIG. 10, the passing points $P_5$ are substantially matched with respective peaks of the arcs of the composed output data. Therefore, for example, the determining part 123 determines whether or not the respective peaks of the arcs of the composed output data are matched with the respective passing points $P_5$, thus detecting the presence or absence of the wafer W. As described above, by composing the output data based on the detection signals which are detected at the pair of optical sensors 22 disposed at the left and right sides of the wafer W, it is possible to easily detect the presence or absence of the wafer W. Further, in some embodiments, in FIG. 10, the determining part 123 may use a threshold set for a height (i.e., a size of a measured length width) of a composed arc in each of the passing points $P_5$ so as to determine whether or not a peak of the composed arc exceeds the threshold and detect the presence or absence of the wafer W.

Figure 11:
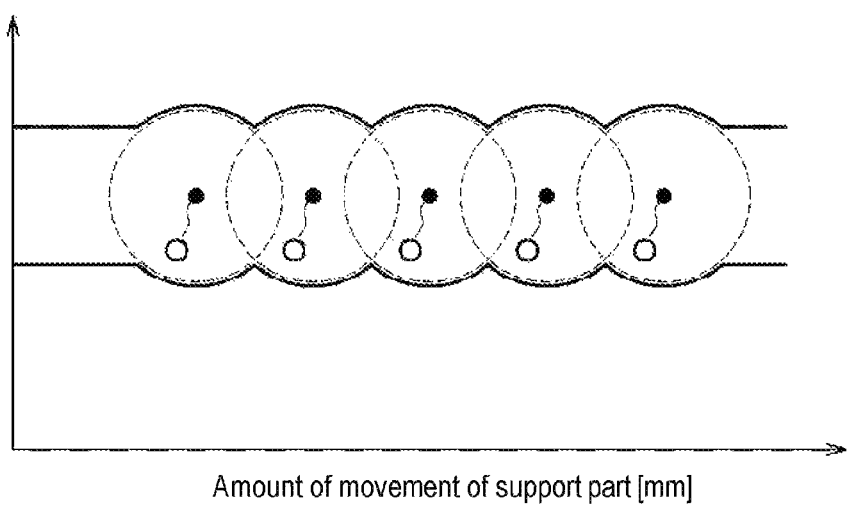
FIG. 11 is a view showing five virtual circles obtained by transforming coordinates of the arc shape output signals shown in FIGS. 9A and 9B.

FIG. 11 shows five virtual circles obtained by transforming coordinates of the arc shape output data shown in FIGS. 9A and 9B in the data processing part 120, wherein the five virtual circles respectively correspond to plan shapes of the five wafers W to be detected. Based on such virtual circles, central coordinates O can be estimated by, for example, a Hough transformation. Further, for example, the determining part 123 compares the central coordinates O of the virtual circles respectively corresponding to the five wafers W with the central coordinates of the respective wafers W in the normal transfer state, thus detecting the presence or absence of the wafer W or the misalignment thereof. In addition, it is possible to calculate an amount of the misalignment of the wafer W on the X-Y plane based on the central coordinates O of the virtual circles respectively corresponding to the five wafers W and the central coordinates of the respective wafers W in the normal transfer state.

Output examples shown in FIGS. 9A, 9B, 10 and 11 are effective as a method of detecting a presence or absence of the wafer W and a misalignment thereof with a simplified way. In this case, a length measuring sensor including the light receiving part 26 equipped with a high definition light receiving element such as a CCD image sensor or the like, may be used as the optical sensor 22.

Further, according to this embodiment, it is possible to detect a trace of an advance/retract motion of the support part 13 of the transfer arm 11a by calculating a difference between the output data shown in FIG. 9A and the output data shown in FIG. 9B. To identify the trace of the support part 13 is effective as a method of detecting malfunction of the transfer arm 11a.

Figure 12:
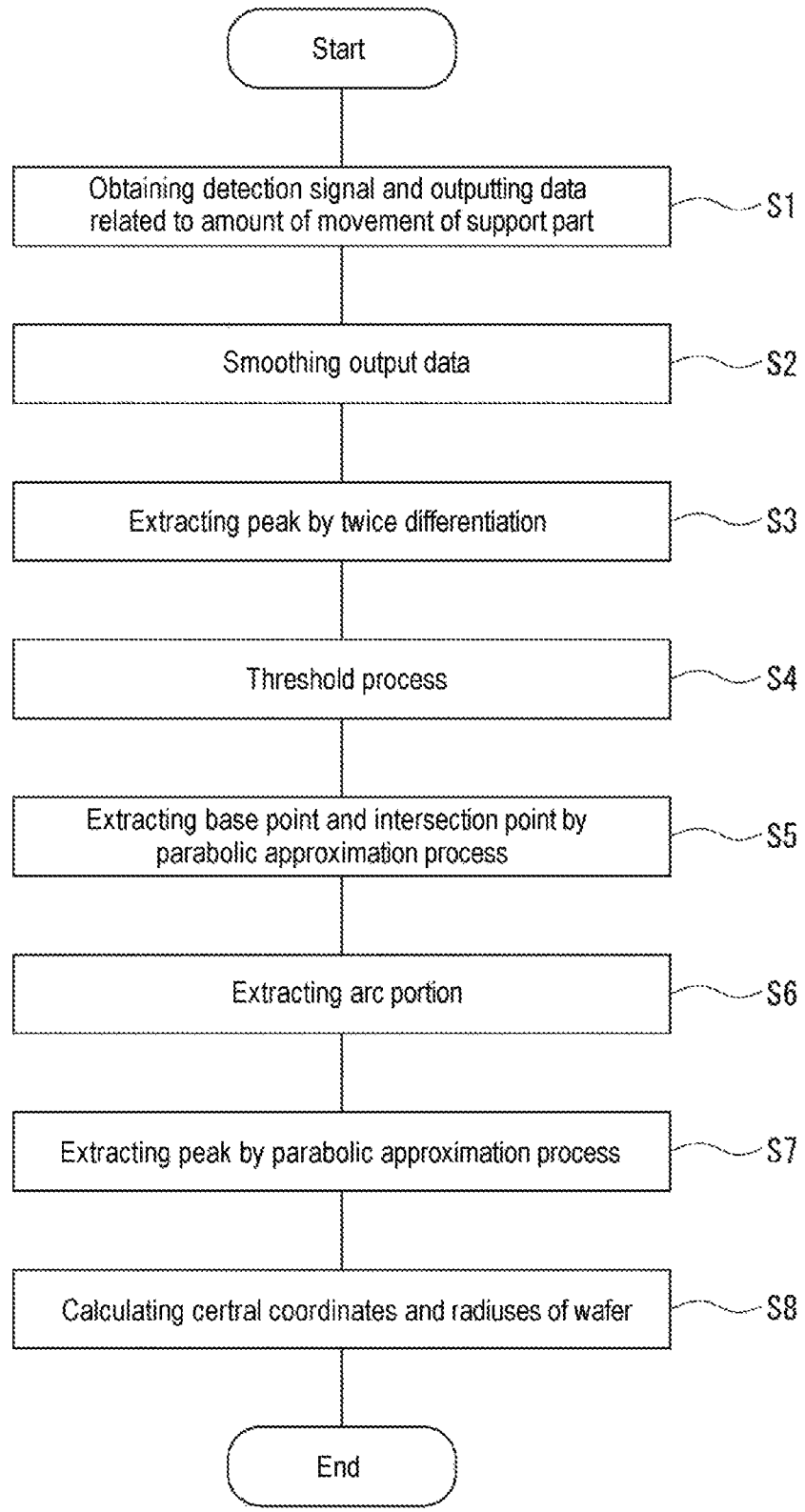
FIG. 12 is a flow chart showing an example of a data processing procedure according to the second embodiment of the present disclosure.

Next, another data processing procedure of detecting a presence or absence of the wafer W and a misalignment thereof using the sensor part 20A according to this embodiment, will be described with reference to FIGS. 12 to 20. FIG. 12 is a flow chart showing an example of the another data processing procedure. This data processing procedure includes, for example, a sequence of steps S1 to S8. Here, steps S1 and S2 are to perform a pre-treatment on the output data. Further, steps S3 to S5 are to extract base points of an arc of the output data or intersection points of the arc with another arc adjacent thereto (hereinafter, sometimes simply referred to as "base points"). In addition, steps S6 to S7 are to extract a peak of the arc of the output data. This procedure is effective in case where a length measurement sensor equipped with a light receiving element (e.g., a photodiode or the like) configured to detect an amount of light, is used as the light receiving part 26 of the optical sensor 22.

Figure 13:
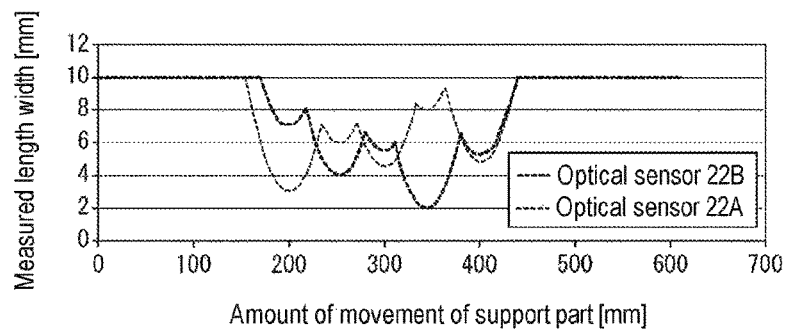
FIG. 13 is a view showing an example of an output data.

(Step S1)
In step S1, the data processing part 120 receives the detection signals obtained at the pair of left and right optical sensors 22A and 22B which are disposed at the left and right side of the wafer W, and outputs the same as an output data including a plurality of arc portions. The plurality of arc portions is related with amounts of movement of the support part 13 of the transfer arm 11a, which is obtained at the encoder. An example of the output data is shown in FIG. 13. In FIG. 13, a vertical axis represents a measured length width obtained at the light receiving part 26, and a horizontal axis represents the amount of movement of the support part 13 of the transfer arm 11a.

(Step S2)
Subsequently, in step S2, a smoothing process as the pre-treatment is performed on the output data. An example of the smoothing process may include obtaining an average value of the remaining data except for maximum and minimum values of the output data which corresponds to the amount of movement of the support part 13 of the transfer arm 11a within a predetermined range.

Figure 14:
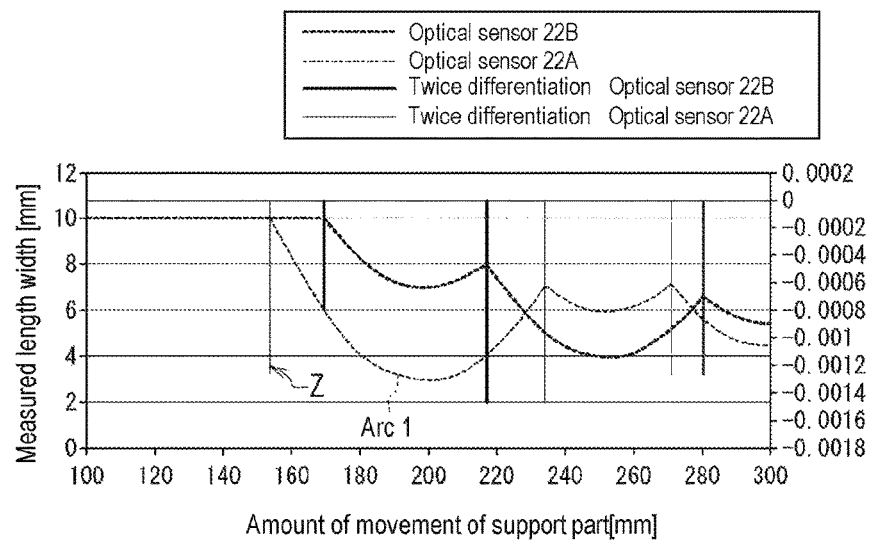
FIG. 14 is a view showing a peak obtained by differentiating the output data twice

(Step S3)
Thereafter, in step S3, the output data which has been subjected to the smoothing process in step S2 is differentiated twice. By such a twice differentiation, as shown in FIG. 14, a plurality of peaks where a substantial change in data occurs is extracted from the respective arc shape data.

Figure 15:
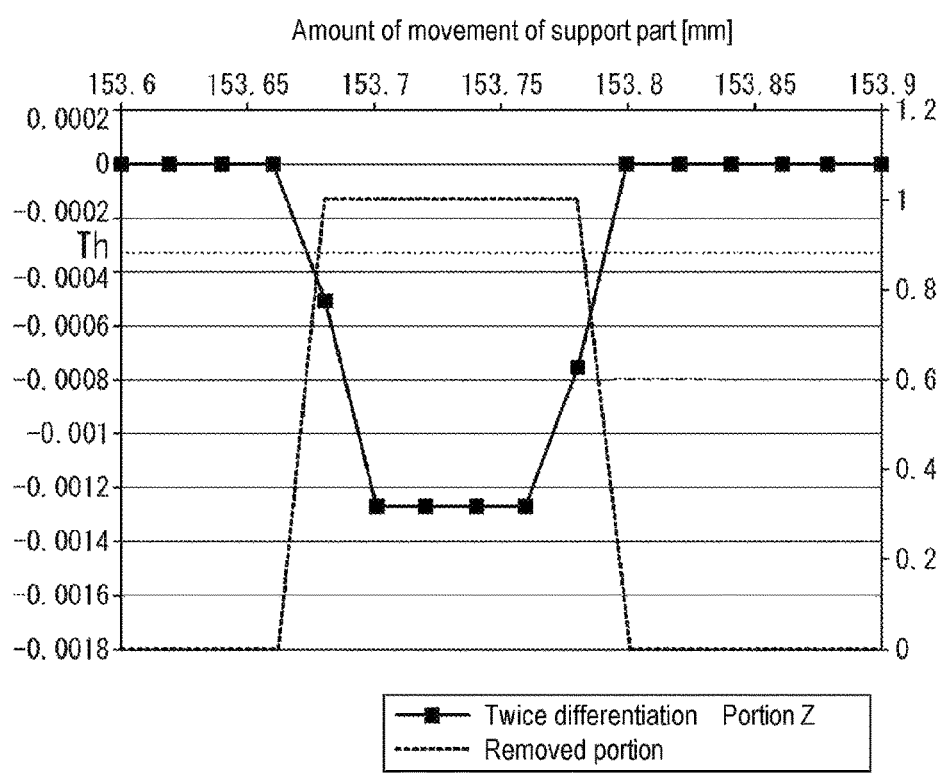
FIG. 15 is a view showing a threshold process.

(Step S4)
Subsequently, in step S4, a threshold process is performed in which each of the peaks obtained in step S3 is compared with a predetermined threshold to remove a portion not satisfying the threshold from a data process target object. FIG. 15 is an enlarged view of one of the peaks (which is indicated by a notation Z in FIG. 14) extracted in step S3. In FIG. 15, the threshold Th is indicated by a broken line. A portion below the threshold Th is a portion satisfying the threshold Th, which is shown as a downwardly protruding trapezoid.

Figure 16:
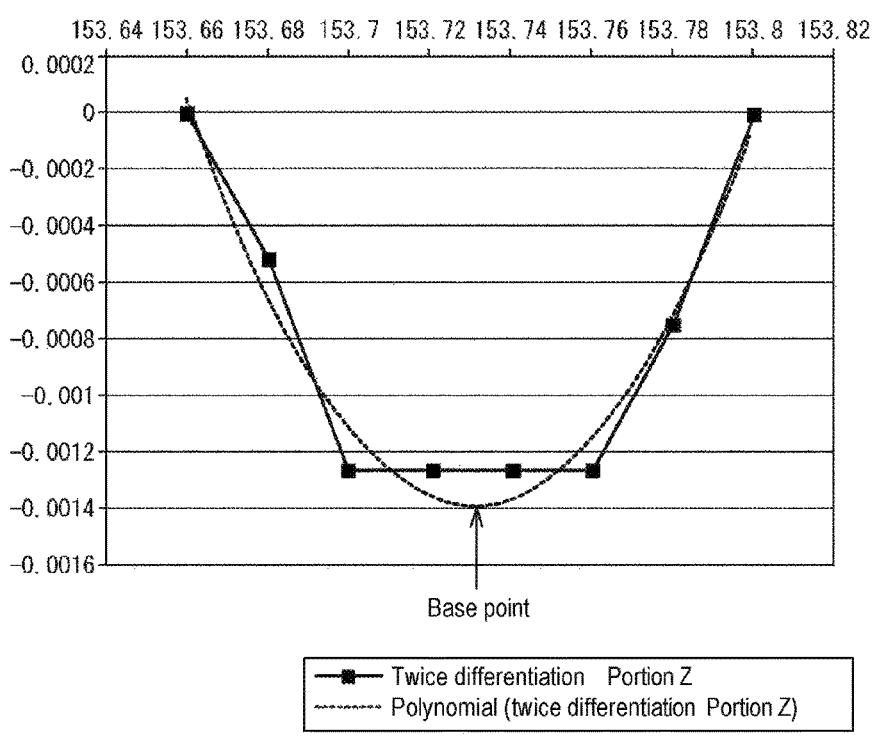
FIG. 16 is a view showing a parabolic approximation process.

(Step S5)
Subsequently, in step S5, a parabolic approximation process is performed on each of a plurality of twice differential data which satisfies the threshold Th using a least square method. FIG. 16 shows a state where the twice differential data of the peak indicated by the notation Z in FIG. 14 is subjected to the parabolic approximation process. As shown in FIG. 16, a peak of an approximated parabola thus obtained is herein defined as a "base point" of the arc. In this way, in step S5, the base point is defined with respect to each of the twice differential data satisfying the threshold Th. This base point means a position where the detection signal obtained at the light receiving part 26 is drastically varied in the course of the transfer. Specifically, the base point corresponds to a portion where some of the band-like light 28 from the light transmitting part 24 are blocked at the edge of the first wafer W, a portion where the band-like light 28 are fully re-transmitted onto the light receiving part 26, or intersection points (in FIG. 5, $P_3$ and $P_4$) of an upper wafer W with a lower wafer W which are apparently overlapped with each other in the vertically direction when viewed from the light transmitting part 24 along the optical axis 27. Further, to accurately detect the intersection points requires irradiating the band-like light 28 from the light transmitting part 24 to fall within the zone covering the portions $P_3$ and $P_4$ (see, FIG. 5) and the X-direction end portion $P_0$, in the normal transfer state.

Figure 17:
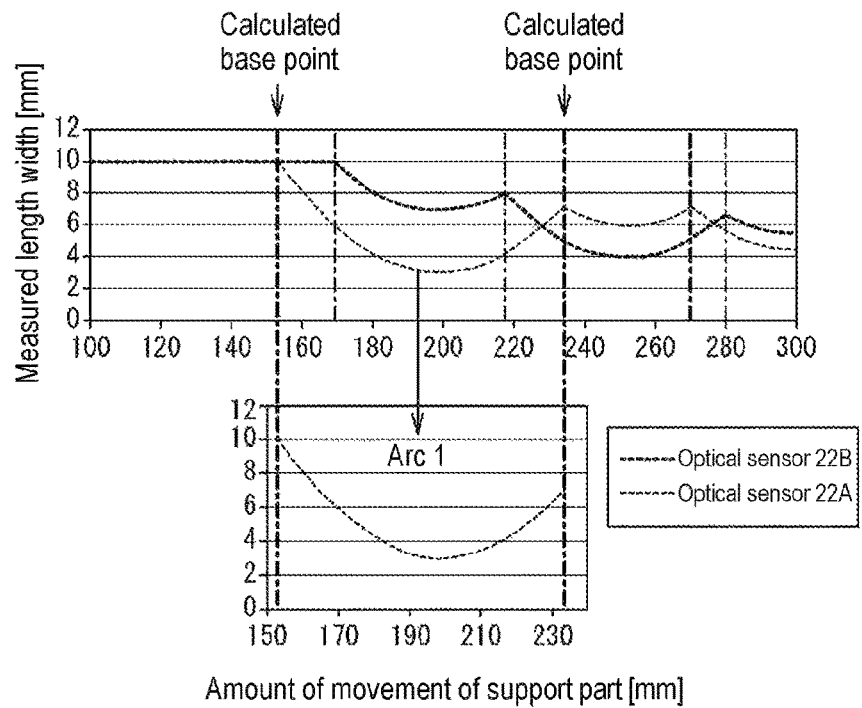
FIG. 17 is a view showing an operation of extracting an arc portion from the output data.

(Step S6)
Subsequently, in step S6, an arc portion is extracted from the output data which has been subjected to the smoothing process in step S2. Specifically, as shown in FIG. 17, data of an arc portion formed between two base points defined in step S5 is extracted. FIG. 17 shows an example in which an arc 1 shown in FIG. 14 is extracted. Data of the extracted arc portion corresponds to a plan shape of an edge near the X-direction end portion $P_0$ of the wafer W, i.e., an outline of the vicinity of the end portion $P_0$.
(Step S7)

Figure 18:
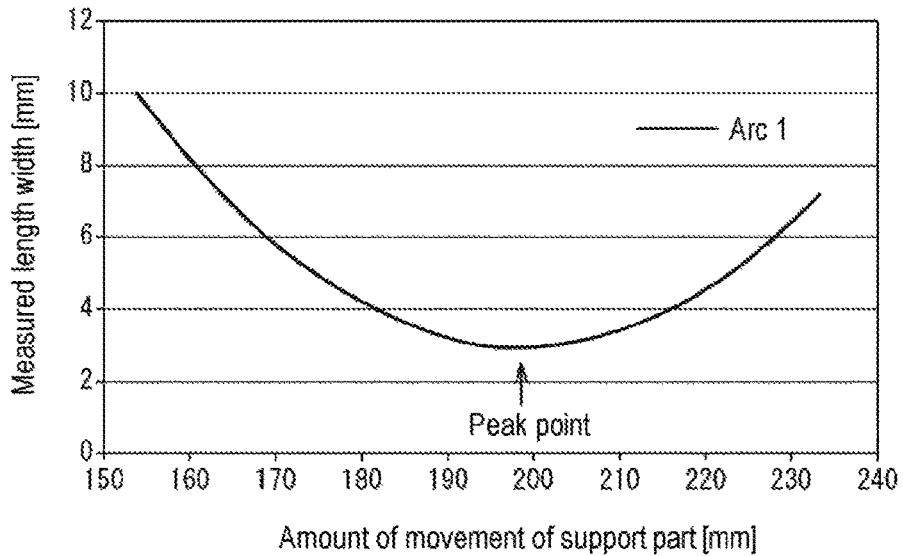
FIG. 18 is a view showing a parabolic approximation process performed on the arc portion obtained in FIG. 17.

Subsequently, in step S7, the parabolic approximation process is performed on the data of the arc portion extracted in step S6 using a least square method. Further, as shown in FIG. 18, a peak of an approximated parabola thus obtained is extracted. This peak corresponds to one of the X-direction end portions $P_0$ of the wafer W.

The sequence of steps S2 to S7 described above is performed with respect to each of the output data based on the detection signals detected at the pair of optical sensors 22A and 22B disposed at the left and right sides of the wafer W. Thus, Y-direction temporal coordinates of the X-direction both end portions $P_0$ of one wafer W, and Y-direction temporal coordinates of the intersection points ($P_3$ and $P_4$ in FIG. 5) of the upper wafer W with the lower wafer W which are apparently overlapped with each other when viewed from the light transmitting part 24 along the optical axis 27, are obtained.
(Step S8)

Thereafter, in step S8, central coordinates O and radii r of the wafers W supported by the support part 13 are calculated based on the temporal coordinates obtained by the sequence of step S2 to S7. Preferably, a central coordinate $O_1$ and a radius $r_1$ of the first wafer W is obtained in step S8. The reason for this is that one positioned nearest to the light receiving part 26 and considered to have the highest detection accuracy is defined as the first wafer W. Subsequently, based on the central coordinate $O_1$ and the radius $r_1$ of the first wafer W, a central coordinate $O_2$ and a radius $r_2$ of the second wafer W adjacent to the first wafer W are calculated. Thereafter, based on the central coordinate $O_2$ and the radius $r_2$ of the second wafer W, a central coordinate $O_3$ and a radius $r_3$ of the third wafer W adjacent to the second wafer W are calculated. In this way, the central coordinates O and the radii r of all the wafers W supported by the hands 13a to 13e of the support part 13 are sequentially calculated.

Figure 19:
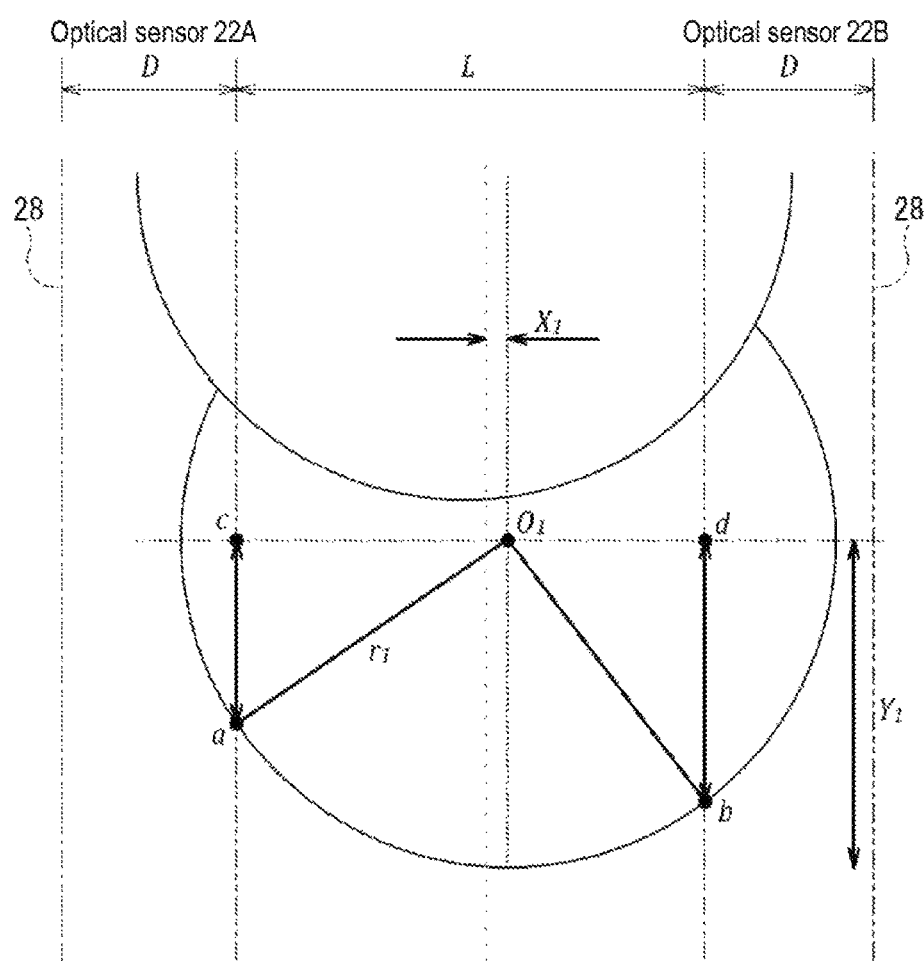
FIG. 19 is a view showing a method of calculating a central coordinate and a radius of a first semiconductor wafer supported by the support part.

FIG. 19 is a view showing an example in which the central coordinate $O_1$ and the radius $r_1$ of the first wafer W are calculated. Here, a point a represents a Y-direction coordinate of the base point of the first wafer W obtained at the left optical sensor 22A, and a point b represents a Y-direction coordinate of the base point of the first wafer W obtained at the right optical sensor 22B. Further, a point c represents a Y-direction coordinate of the left end portion $P_0$ of the first wafer W obtained at the left optical sensor 22A, and a point d represents a Y-direction coordinate of the right end portion $P_0$ of the first wafer W obtained at the right optical sensor 22B. In addition, $Y_1$ represents an average of the Y-direction coordinates of the points c and d obtained at the encoder. Further, a length L represents a gap between the band-like lights 28 of the left and right optical sensors 22A and 22B, and $X_1$ represents a deviation of the central coordinate $O_1$ of the first wafer W from a center point of the length L in the X direction. These parameters have relations as represented by the following formulas (1) to (6). Moreover, in the formulas (1) to (6), for example, a notation "ac" represents a distance between the points a and c. In formula (4), a distance $cO_1$ between the point c and the central coordinate $O_1$ is derived based on the Y-direction coordinates of the points a, b, c and d obtained in steps S1 to S8, and a value of the length L as the gap between the left and right optical sensors 22A and 22B. Further, with the formulas (5) and (6), the deviation $X_1$ of the central coordinate $O_1$ of the first wafer W and the radius $r_1$ thereof can be calculated based on the distance $cO_1$ obtained by the formula (4).

$$Y_1 = (c+d)/2 \tag{1}$$

$$(cO_1)^2 + (ac)^2 = (dO_1)^2 + (bd)^2 \tag{2}$$

$$cO_1 + dO_1 = L \tag{3}$$

$$cO_1 = \frac{L^2 + (bd)^2 - (ac)^2}{2L} \tag{4}$$

$$X_1 = \frac{L}{2} - cO_1 \tag{5}$$

$$r_1 = \sqrt{(cO_1)^2 + (ac)^2} \tag{6}$$

Figure 20:
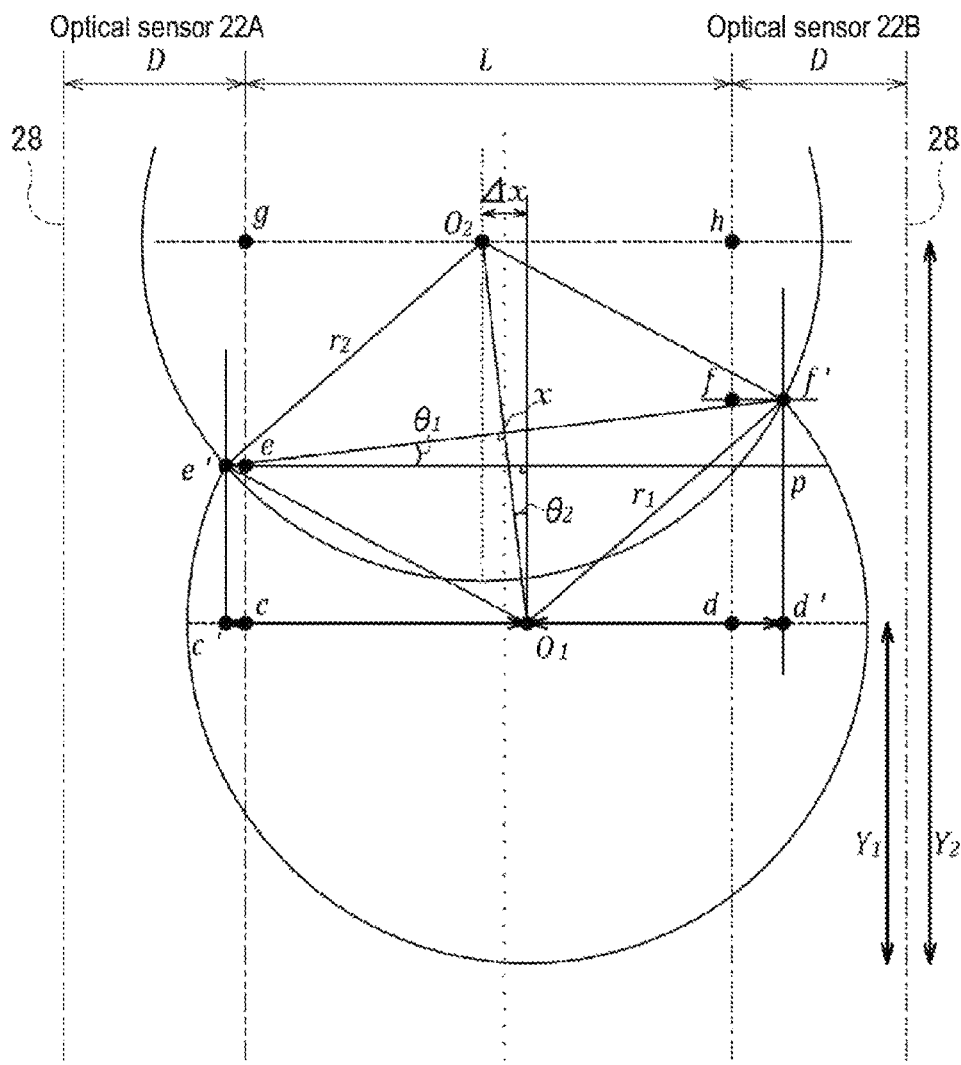
FIG. 20 is a view showing a method of calculating a central coordinate and a radius of a second semiconductor wafer supported by the support part.

FIG. 20 is a view showing an example in which the central coordinates $O_2$ and the radius $r_2$ of the second wafer W are calculated based on the calculation results of the first wafer W. Here, a point e represents a Y-direction coordinate of the base point of the second wafer W obtained at the left optical sensor 22A, and a point f represents a Y-direction coordinate of the base point of the second wafer W obtained at the right optical sensor 22B. Further, a point g represents a Y-direction coordinate of the left end portion $P_0$ of the second wafer W obtained at the left optical sensor 22A, and a point h represents a Y-direction coordinate of the right end portion $P_0$ of the second wafer W obtained at the right optical sensor 22B. In addition, a length $Y_2$ is an average of the Y-direction coordinates of the points g and h obtained at the encoder. Further, $\Delta x$ represents a deviation of the central coordinate $O_2$ of the second wafer W with respect to the central coordinate $O_1$ of the first wafer W in the X direction. These parameters have relations as represented by the following formulas (7) to (19). Further, in the formulas (7) to (19), for example, a notation "$O_2O_1$" represents a distance between the points $O_2$ and $O_1$.

$$Y_2 = (g+h)/2 \tag{7}$$

$$f'd'=f-d \tag{8}$$

$$e'c'=e-c \tag{9}$$

$$f'p=f-e \tag{10}$$

$$e'p = \sqrt{r_1^2 - f'd'^2} + \sqrt{r_1^2 - e'c'^2} \tag{11}$$

$$\theta_1 = a\tan 2(e'p, f'p) \tag{12}$$

$$\theta_2 = \theta_1 \tag{13}$$

$$\Delta x = (Y_2 - Y_1)*\tan(\theta_2) \tag{14}$$

$$O_2O_1 = \sqrt{\Delta x^2 + (Y_2 - Y_1)^2} \tag{15}$$

$$xf = [\sqrt{(e'p)^2 + (f'p)^2}]/2 \tag{16}$$

$$xO_1 = \sqrt{r_1^2 - (xf)_2} \tag{17}$$

$$O_2x = O_2O_1 - xO_1 \tag{18}$$

$$r_2 = \sqrt{(O_2x)^2 + (xf)^2} \tag{19}$$

By repeating the above calculations, it is possible to sequentially calculate the central coordinates O and the radii r of the plurality of wafers W. Further, if the wafer W does not exist in any one of the hands 13a to 13e, the following procedure may be performed. For example, assuming that the wafer W does not exist in the hand 13c, the central coordinate $O_a$ and the radius $r_a$ of the wafer (e.g., first wafer) W supported by the hand 13a are first calculated. And then, based on the central coordinate $O_a$ and the radius $r_a$ of the first wafer W, the central coordinates $O_b$ and the radius $r_b$ of the wafer (e.g., second wafer) W supported by the hand 13b adjacent to the hand 13a are calculated. Subsequently, a central coordinate $O_d$ and a radius $r_d$ of the wafer (e.g., new first wafer) W supported by the hand 13d are calculated. And then, based on the central coordinate $O_d$ and the radius $r_d$, a central coordinate $O_e$, and a radius $r_e$ of the wafer (e.g., new second wafer) W supported by the hand 13e adjacent to the hand 13d are calculated.

For example, the determining part 123 compares the central coordinates O of the wafers W obtained in this way with the respective central coordinates in the normal transfer state, respectively. Thus, it is possible to detect whether or not the wafer W is misaligned and calculate an amount of the misalignment of the wafer W in the X and Y directions.

As described above, in this embodiment, the optical axes 27 of at least one pair of the optical sensors 22A and 22B are disposed at left and right sides such that the band-like lights 28 are irradiated onto the vicinities of the X-direction both end portions $P_0$ of the wafer W in a state where the optical axes 27 are inclined in any one of the advance and retract directions (i.e., the Y direction) of the support part 13. With this configuration, when collectively transferring the plurality of wafers W held in multi-stage processing, it is possible to detect whether or not the wafer W exists, or whether or not a misalignment thereof occurs, using the two optical sensors 21A and 21B.

Other configurations and effects according to this embodiment are the same as those of the first embodiment.

According to the present disclosure in some embodiments, it is possible to surely detect a presence or absence of a substrate or a misalignment thereof using a reduced number of sensors, while transferring a plurality of substrates held in multi-stage processing.

While certain embodiments have been described, these embodiments have been presented by way of example only, and are not intended to limit the scope of the disclosures. As an example, contents of the data processing which is performed with respect to the detection signals obtained at the optical sensors 21 and 22, or the procedure of detecting the presence or absence of the wafer W or the misalignment thereof based on based on the results of the data processing, are not limited to the methods described in the above embodiments.

Further, the substrate is not limited to the semiconductor wafer, but may be a circular substrate.

What is claimed is:

1. A substrate detection apparatus of detecting whether or not a substrate is normally supported by a support part at a predetermined position, in a transfer device including the support part configured to support a plurality of disc-like substrates in multi-stage processing at vertical intervals, the substrate detection apparatus comprising:
    a plurality of optical sensors, each of the plurality of optical sensors including a light transmitting part configured to irradiate a light and a light receiving part configured to receive the light from the light transmitting part,
    wherein, when the plurality of disc-like substrates is collectively transferred while being normally supported by the support part at the predetermined positions, at least one pair of the plurality of optical sensors are disposed such that:
        the two lights irradiated from the two light transmitting parts of the at least one pair of the plurality of optical sensors are sequentially blocked at each of the plurality of disc-like substrates from a lowermost disc-like substrate among the plurality of disc-like substrates which is closest to a bottom of the support part; and
        the two lights irradiated from the two light transmitting parts of the at least one pair of the plurality of optical sensors respectively travel onto vicinities of both end portions of the each of the plurality of disc-like substrates, the both end portions being disposed in a direction which is in a horizontal plane and is perpendicular to a transfer direction of the each of the plurality of disc-like substrates, and
    wherein one of the light transmitting part and the light receiving part is arranged above an uppermost disc-like substrate among the plurality of substrates, and the other of the light transmitting part and the light receiving part is arranged below the lowermost disc-like substrate.

2. The substrate detection apparatus of claim 1, wherein when the plurality of disc-like substrates is collectively transferred while being normally supported by the support part at the predetermined positions, the at least the one pair of plurality of optical sensors are disposed such that, optical axes of the lights irradiated from the light transmitting parts of the at least one pair of the plurality of optical sensors toward the light receiving part respectively intersect with an upper surface or a lower surface of each of the plurality of disc-like substrates at an angle except for a vertical direction.

3. The substrate detection apparatus of claim 2, wherein, when the plurality of disc-like substrates is collectively transferred, the at least one pair of optical sensors irradiate the light in sequence starting from one of the plurality of disc-like substrates held in the lowermost stage to one of the plurality of disc-like substrates held in the uppermost stage.

4. The substrate detection apparatus of claim 2, wherein, when the plurality of disc-like substrates is collectively transferred, the at least one pair of optical sensors irradiate the light in sequence starting from one of the plurality of disc-like substrates held in the uppermost stage to one of the plurality of disc-like substrates held in the lowermost stage.

5. A substrate processing system comprising:
    a transfer device including a support part configured to support a plurality of disc-like substrates in multi-stage processing at vertical intervals; and
    a substrate detection apparatus configured to detect whether or not the plurality of substrates is normally supported by the support part of the transfer device at predetermined positions,
    wherein the substrate detection apparatus is provided with a plurality of optical sensors, each of the plurality of optical sensors including a light transmitting part configured to irradiate a light and a light receiving part configured to receive the light from the light transmitting part, and
    wherein, when the plurality of disc-like substrates is collectively transferred while being normally supported by the support part at the predetermined positions, at least one pair of the plurality of optical sensors are disposed such that:

the two lights irradiated from the two light transmitting parts of the at least one pair of the plurality of optical sensors are sequentially blocked at each of the plurality of disc-like substrates from a lowermost disc-like substrate among the plurality of disc-like substrates which is closest to a bottom of the support part; and the two lights irradiated from the two light transmitting parts of the at least one pair of the plurality of optical sensors respectively travel onto vicinities of both end portions of the each of the plurality of disc-like substrates, the both end portions being disposed in a direction which is in a horizontal plane and is perpendicular to a transfer direction of the each of the plurality of disc-like substrates, and wherein one of the light transmitting part and the light receiving part is arranged above an uppermost disc-like substrate among the plurality of substrates, and the other of the light transmitting part and the light receiving part is arranged below the lowermost disc-like substrate.

6. The substrate processing system of claim 5, wherein when the plurality of substrates is collectively transferred by the transfer device while being normally supported by the support part at the predetermined positions, the at least one pair of disc-like optical sensors are disposed such that optical axes of the light irradiated from the light transmitting parts of the at least one pair of the plurality of optical sensors toward the light receiving part respectively intersect with an upper surface or a lower surface of each of the plurality of disc-like substrates at an angle except for a vertical direction.

7. The substrate processing system of claim 6, wherein, when the plurality of disc-like substrates is collectively transferred by the transfer device, the at least one pair of optical sensors irradiate the light in sequence starting from one of the plurality of disc-like substrates held in the lowermost stage to one of the plurality of disc-like substrates held in the uppermost stage.

8. The substrate processing system of claim 6, wherein, when the plurality of disc-like substrates is collectively transferred by the transfer device, the at least one pair of optical sensors irradiate the light in sequence starting from one of the plurality of disc-like substrates held in the uppermost stage to one of the plurality of disc-like substrates held in the lowermost stage.

9. The substrate processing system of claim 6, wherein at least one of a presence or absence of each of the plurality of disc-like substrates and a misalignment of each of the plurality of disc-like substrates are detected based on a change in detection signal detected at the light receiving part in the at least one pair of optical sensors and an amount of a movement of the support part, which are generated with the transfer of the substrate.

10. The substrate processing system of claim 9, wherein the light transmitting part is configured to irradiate a spotlight, and
wherein the change in detection signal is obtained when the spotlight is blocked at one of the plurality of disc-like substrates and then re-transmitted onto the light receiving part.

11. The substrate processing system of claim 9, wherein the light transmitting part is configured to irradiate the light having a predetermined width, and
wherein the change in detection signal is obtained when some or all of the light having the predetermined width are blocked at one of the plurality of disc-like substrates and then re-transmitted onto the light receiving part.

12. The substrate processing system of claim 11, further comprising: a data processing part configured to perform a data processing on the detection signal,
wherein the data processing part transforms the change in detection signal to a plurality of arc shape data, the arc shape data being obtained by imaging outlines of the vicinities of both end portions of each of the plurality of substrates vertically arranged in multi-stage processing, on the same plane.

13. The substrate processing system of claim 12, wherein the data processing part extracts coordinates of base points of an arc, intersection points of the arc with other arcs adjacent to the arc, and a peak of the arc, based on the plurality of arc shape data.

14. The substrate processing system of claim 13, wherein the data processing part extracts the coordinates of the base points and the intersection points by differentiating the arc shape data twice, following by performing a parabolic approximation process on the differentiated arc shape data.

15. The substrate processing system of claim 13, wherein the data processing part extracts the coordinates of the peak by performing the parabolic approximation process on the arc shape data.

16. A substrate detection method of detecting, using the substrate detection apparatus of claim 1, at least one of a presence or absence of a substrate and a misalignment thereof based on a change in detection signal obtained at a light receiving part in at least one pair of optical sensors and an amount of movement of a support part.

* * * * *